United States Patent [19]

DelBello

[11] 4,281,221

[45] Jul. 28, 1981

[54] CONDENSER MICROPHONE

[75] Inventor: Vincenzo DelBello, Milan, Italy

[73] Assignee: Societa Italiana Telecomunicazioni Siemens S.p.A., Milan, Italy

[21] Appl. No.: 56,648

[22] Filed: Jul. 11, 1979

[30] Foreign Application Priority Data

Jul. 12, 1978 [IT] Italy .............................. 25585 A/78

[51] Int. Cl.[3] ......................... H03F 1/34; H04R 3/00; H04R 19/00

[52] U.S. Cl. ................................. 179/111 R; 179/1 F

[58] Field of Search ............... 179/111 R, 111 E, 1 F; 330/105, 260

[56] References Cited

U.S. PATENT DOCUMENTS

| | | | |
|---|---|---|---|
| 3,116,366 | 12/1963 | Seligson | 179/111 R X |
| 3,190,972 | 6/1965 | Schoeps et al. | 179/111 R |
| 3,393,271 | 7/1968 | Fidi et al. | 179/1 F |
| 3,913,024 | 10/1975 | Necoechea | 179/1 F X |

FOREIGN PATENT DOCUMENTS

| | | | |
|---|---|---|---|
| 1372352 | 10/1974 | United Kingdom | 179/111R |

*Primary Examiner*—Thomas W. Brown
*Attorney, Agent, or Firm*—Karl F. Ross

[57] ABSTRACT

An electroacoustic transducer comprises a condenser of variable capacitance, responsive to acoustic waves impinging upon its plates, connected across a source of d-c voltage in a circuit of negligible ohmic resistance by way of two reactive impedance elements with reactances of equal frequency-dependent magnitude and opposite sign, specifically a positive and a negative capacitance, in series with each other. The negative-capacitance element is formed by an ancillary capacitor in the output of an impedance-inverting four-terminal network including an operational amplifier with resistive feedback. The output signal is taken off across one of the two series-connected impedance elements.

4 Claims, 6 Drawing Figures

PRIOR ART

CONDENSER MICROPHONE

FIELD OF THE INVENTION

My present invention relates to an electroacoustic transducer or microphone including a condenser whose capacitance varies with ambient air pressure so as to translate impinging acoustic waves into electrical signals.

BACKGROUND OF THE INVENTION

Transducers of this character are frequently used in precision-type instruments of physics laboratories, electromedical equipment, geological probes, military installations such as sonar devices, and sound-recording apparatus.

The capacitance of such a condenser, varying as a function of time in the presence of a sinusoidal acoustic wave, is given by $$C(t)=C_0C_1 \sin \omega t$$

where $C_0$ is the magnitude of the static capacitance of the condenser and $C_1$ is the increment resulting from an acoustic wave of given intensity and pulsatance $\omega t=2\pi f$. The maximum ratio $C_1/C_0$ is generally very low, on the order of $10^{-4}/3$.

Conventionally, the pressure-sensitive condenser is connected across a source of d-c voltage in series with a load resistor across which an output signal is available. The circuit resistance R, which includes the load resistor as well as the relatively minor internal resistance of the source, is traversed by a current i given by the equation $$(C_0 + C_1\sin\omega t)R\frac{di}{dt} + (1 + RC_1\omega\cos\omega t)i - EC_1\omega\cos\omega t = 0 \quad (1)$$

where E is the terminal voltage of the d-c source; see Physical Review 1917, Vol. X, No. 1, page 39. This equation can be solved for i to yield $$I=\Sigma I_n \sin (n\omega t+\phi_n) \quad (2)$$

where n is 1, 2, 3 etc. Considering only the first two terms, for which n=1 and n=2, one obtains $$i = \frac{E C_1}{C_0\sqrt{\left(\frac{1}{\omega C_0}\right)^2 + R^2}}\sin(\omega t + \phi_1) - \frac{EC_1^2R}{C_0^2\sqrt{\left[\left(\frac{1}{\omega C_0}\right)^2 + 4R^2\right]\cdot\left[\left(\frac{1}{\omega C_0}\right)^2 + R^2\right]}}\sin(\omega t + \phi_1 - \phi_2); \quad (3)$$

the higher-order terms, omitted in equation (3), are of progressively diminishing amplitudes.

Theoretically, therefore, the electrical output signal appearing across the load resistor has an infinite number of harmonics distorting its waveform. The ratio between the second harmonic (n=2) to the fundamental (n=1) is given, according to equation (3), by $$\frac{C_1R}{C_0\sqrt{\left(\frac{1}{\omega C_0}\right)^2 + 4R^2}}$$

which tends to $C_1/2C_0$ for $2R>>1/\omega C_0$. That ratio, accordingly, increases with the dynamic range $\pm C_1/C_0$ of the pressure-sensitive condenser. On the other hand, the aforementioned low value of this dynamic range necessitates the availability of a rather elevated d-c biasing voltage E (e.g. of 50 to 100 volts) in order to produce a useful output signal.

OBJECTS OF THE INVENTION

An object of my present invention, therefore, is to provide an improved condenser microphone whose output signal is free from harmonics distortion and therefore has a frequency spectrum equal to that of the incident acoustic wave.

Another object is to provide a condenser microphone of this character whose signal amplitude is of the order of magnitude of the biasing voltage supplied.

SUMMARY OF THE INVENTION

I realize these objects, in accordance with my present invention, by connecting the pressure-sensitive condenser across a source of d-c biasing voltage in a circuit of insignificant ohmic resistance including two reactive impedance elements with reactances of equal frequency-dependent magnitude and opposite sign connected in series with each other and with the condenser; the output signal is obtained across one of these two impedance elements.

By "reactances of equal frequency-dependent magnitude and opposite sign" I mean either a positive and a negative inductance or a positive and a negative capacitance, preferably the latter. The presence of two complementary reactance elements of the same type insures that their combined impedance is substantially zero for any acoustic frequency and not just for a single resonant frequency as would be the case if a capacitor were paired with an inductor.

The negative reactance is obtained, in a manner known per se, by connecting an impedance-inverting four-terminal network across an ancillary reactance element, preferably a capacitor. If that inverter has a transmission or conversion ratio of −1, the reactance of the ancillary element will be substantially identical with that of the associated positive-reactance element in series therewith.

BRIEF DESCRIPTION OF THE DRAWING

The above and other features of my present invention will now be described in detail with reference to the accompanying drawing in which.

SPECIFIC DESCRIPTION

Figure 1:
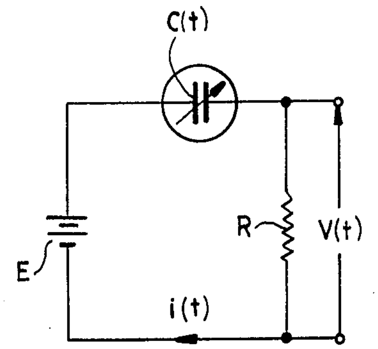
FIG. 1 is a diagram showing the equivalent circuit of a conventional condenser microphone.

FIG. 1 represents a conventional microphone with a condenser C(t) whose capacitance is variable by ambient air pressure so as to translate an incident acoustic wave into an electrical output signal V(t) developed across a resistor R in series therewith. A source of d-c voltage E, illustrated as a battery, is connected across the series combination of condenser C(t) and resistor R to charge that condenser whereby an alternating current i(t) flows in the circuit whenever a periodic pressure variation acts upon one or both plates of this condenser to vary its capacitance. The output voltage $V(t)=R\cdot i(t)$ is given by equation (3), supra, and is rich in harmonics as per that equation. The internal resistance of source E is assumed to be small compared with that of resistor R.

Figure 2:
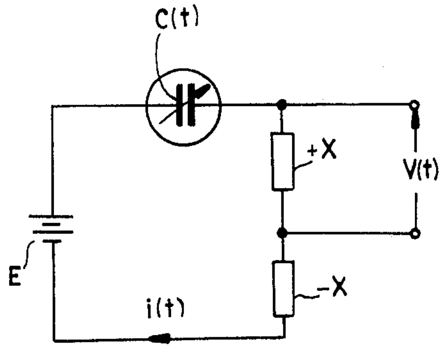
FIG. 2 is a diagram similar to FIG. 1, showing the equivalent circuit of an improved condenser microphone according to my invention.

The circuit of FIG. 2 differs from that of FIG. 1 in that the resistor R has been replaced by two reactive impedance elements with reactances of opposite sign, designated +X and −X, having identical frequency-dependent magnitudes as discussed above. The output voltage V(t) is developed across one of these two reactive elements, here impedance element +X, and thus has a magnitude equal to X·i(t). Since the overall circuit resistance is negligible, the current i(t) has substantially the value obtained from equation (3) with R=0, thus $i(t)=EC_1\omega\cos\omega t$. If the reactance of element X is a capacitance C, so that its impedance will have the absolute magnitude 1/ωC, the output signal (disregarding phase shift) is given by $V(t)=(EC_1/C)\cos\omega t$; when the capacitance excursion $C_1$ is equal to C, the signal amplitude substantially corresponds to biasing voltage E.

Figure 3:
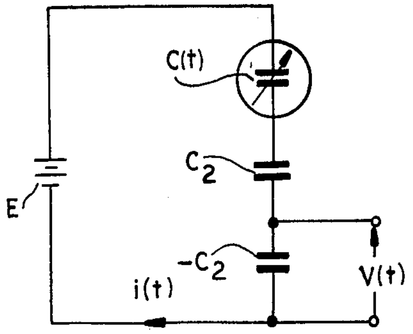
FIG. 3 is a circuit diagram of a preferred embodiment of my invention.

FIG. 3 shows the two reactance elements +X and −X as elements of positive and negative capacitance $C_2$ and $-C_2$, respectively. The output signal V(t) is here taken off the negative-capacitance element $-C_2$ but its magnitude will be the same as in the case where it is derived from the positive-capacitance element $C_2$ in the manner illustrated in FIG. 2.

Figure 4:
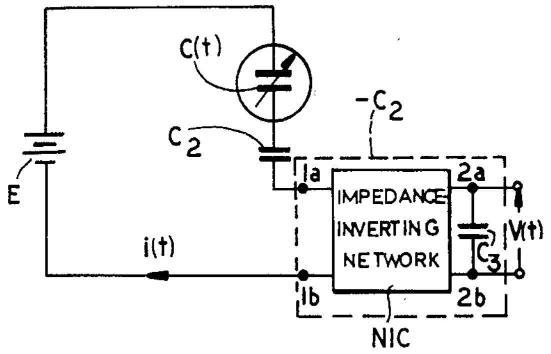
FIG. 4 is a more elaborate circuit diagram similar to FIG. 3.

In FIG. 4 I have shown the physical realization of negative-capacitance element $-C_2$ as an impedance-inverting network NIC having input terminals 1*a*, 1*b* in series with the first capacitor $C_2$ and output terminals 2*a*, 2*b* connected across a second capacitor $C_3$; output voltage V(t) is developed across these latter terminals.

Network NIC has a transmission ratio −K so chosen that $C_2=C_3/K$; *capacitor* $C_3$ will then be traversed by a current equal to $KEC_1\omega\cos\omega t$, thus developing an output voltage $V(t)=(KEC_1/C_3)\cos\omega t$. With K=1, therefore, $C_3$ should be equal to $C_2$. With $C_2=C_1$ there will again exist substantial identity between the signal amplitude and the biasing voltage E.

Figure 5:
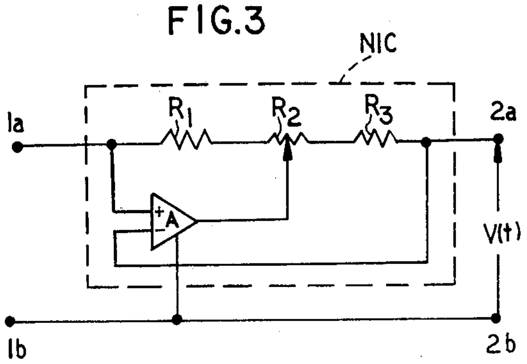
FIG. 5 shows details of an impedance-inverting network included in the circuit of FIG. 4.

As more fully illustrated in FIG. 5, network NIC comprises an operational amplifier A with three series resistors $R_1$, $R_2$ and $R_3$ inserted between its terminal 1*a* and 2*a* which are respectively connected to the noninverting and the inverting input thereof. The middle resistor $R_2$ is a potentiometer having a tap connected to the amplifier output; terminals 1*b* and 2*b* are directly interconnected and tied to a reference input of the amplifier. A shifting of that tap enables an adjustment of the conversion ratio −K of the network, as is well known per se.

Figure 6:
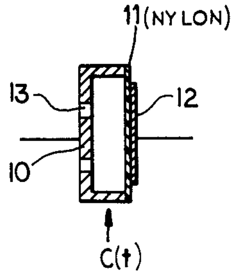
FIG. 6 is a schematic cross-sectional view of a pressure-sensitive condenser forming part of the microphone represented by FIGS. 2–5.

An electroacoustic transducer according to my invention, as described with reference to FIGS. 2–5, responds with high fidelity to frequencies ranging from a few Hz to several tens of KHz and is therefore eminently suitable for use in telephone receivers. This fidelity is enhanced if the condenser C(t) has the structure shown in FIG. 6, comprising a metallic housing 10 which acts as a stationary plate and supports a mobile plate in the form of a membrane 11 of plastic material, preferably nylon, coated on one or both sides with a metallic layer 12. The housing may have apertures 13 facilitating the equalization of air pressure on opposite sides of the membrane.

As will be apparent from the foregoing, the use of a positive and a negative capacitance as the reactances of elements +X and −X of FIG. 2 makes the output voltage V(t) independent of frequency; if inductances were used instead, the signal amplitude would vary with the square of the frequency. These considerations apply, of course, only when voltage V(t) is fed to a load of virtually infinite impedance, such as the input of an operational amplifier.

I claim:

1. An electroacoustic transducer comprising:

a condenser of a capacitance variable in response to changes in ambient air pressure;

a source of d-c voltage;

a circuit of insignificant ohmic resistance connecting said condenser across said source;

two reactive impedance elements with reactances of equal frequency-dependent magnitude and opposite sign connected in series with each other and with said condenser and said source in said circuit, one of said impedance elements being a first capacitor, the other of said impedance elements being an impedance-inverting four-terminal network with output terminals connected across a second capacitor; and a pair of load terminals connected across one of said impedance elements.

2. A transducer as defined in claim 1 wherein said network has a transmission ratio of −1, said second capacitor being of the same magnitude as said first capacitor.

3. A transducer as defined in claim 1 wherein said network includes an operational amplifier with adjustable feedback.

4. A transducer as defined in claim 1, 2 or 3 wherein said condenser comprises a mobile plate in the form of a conductively coated nylon membrane.

* * * * *